United States Patent
Ditri et al.

(10) Patent No.: US 10,306,802 B1
(45) Date of Patent: May 28, 2019

(54) MICRO JET IMPINGEMENT HEAT SINK (71) Applicant: Lockheed Martin Corporation, Bethesda, MD (US)

(72) Inventors: John Ditri, Huntingdon Valley, PA (US); Joseph W. Hahn, Erial, NJ (US); Michael K. McNulty, Cherry Hill, NJ (US)

(73) Assignee: Lockheed Martin Corporation, Bethesda, MD (US)

( * ) Notice: Subject to any disclaimer, the term of this patent is extended or adjusted under 35 U.S.C. 154(b) by 339 days.

(21) Appl. No.: 14/957,011

(22) Filed: Dec. 2, 2015

Related U.S. Application Data (60) Provisional application No. 62/211,443, filed on Aug. 28, 2015.

(51) Int. Cl.
  *H05K 7/20* (2006.01)

(52) U.S. Cl.
  CPC ..... *H05K 7/20263* (2013.01); *H05K 7/20272* (2013.01); *H05K 7/20281* (2013.01)

(58) Field of Classification Search
  CPC ............ H05K 7/20263; H01L 23/4735; H01L 23/4336; H01L 23/473
  See application file for complete search history.

(56) References Cited

U.S. PATENT DOCUMENTS

| | | | | |
|---|---|---|---|---|
| 5,263,536 A | * | 11/1993 | Hulburd | H01S 5/02423 165/104.33 |
| 2002/0112847 A1 | * | 8/2002 | Nakahama | H01L 23/4735 165/104.11 |
| 2012/0097373 A1 | * | 4/2012 | Kandlikar | F28D 15/0266 165/104.29 |

OTHER PUBLICATIONS

Ditri et al. "Embedded Microfluidic Cooling of High Heat Flux Electronic Components" Aug. 5, 2014.*
Ditri, John et al., "Embedded Microfluidic Cooling of High Heat Flux Electronic Components," Lester Eastman Conference on High Performance Devices (LEC), Aug. 5, 2014.

* cited by examiner

*Primary Examiner* — Jon T. Schermerhorn, Jr.
(74) *Attorney, Agent, or Firm* — Howard IP Law Group (57) ABSTRACT

A heat sink for cooling an integrated circuit device includes a body having a first side and a second side. A fluid inlet opening is formed in the second side of the body for receiving pressurized fluid from a fluid source. A plurality of impingement openings are formed in the first side of the body. At least one fluid delivery channel is provided and configured to deliver pressurized fluid from the fluid inlet opening to the plurality of impingement openings for generating a plurality of fluid streams expelled from the plurality of impingement openings. A plurality of fluid diverters are formed on the first side of the body and arranged generally between each of the plurality of impingement openings for diverting a flow of fluid around each of the plurality of impingement openings.

19 Claims, 9 Drawing Sheets

MICRO JET IMPINGEMENT HEAT SINK

CROSS-REFERENCE TO RELATED APPLICATION

This application claims the benefit of and priority to U.S. Provisional Patent Application Ser. No. 62/211,443, filed Aug. 28, 2015, the entire disclosure of which is incorporated by reference herein for all purposes.

STATEMENT OF GOVERNMENT INTEREST

This invention was made with Government support under Contract FA8650-14-C-7647. The Government has certain rights in this invention.

FIELD OF THE INVENTION

The present disclosure relates to cooling systems and methods for use with electronic circuits, and more particularly, to heat sinks featuring embedded cooling provisions for use with, for example, integrated circuit packages.

BACKGROUND

Figure 1:
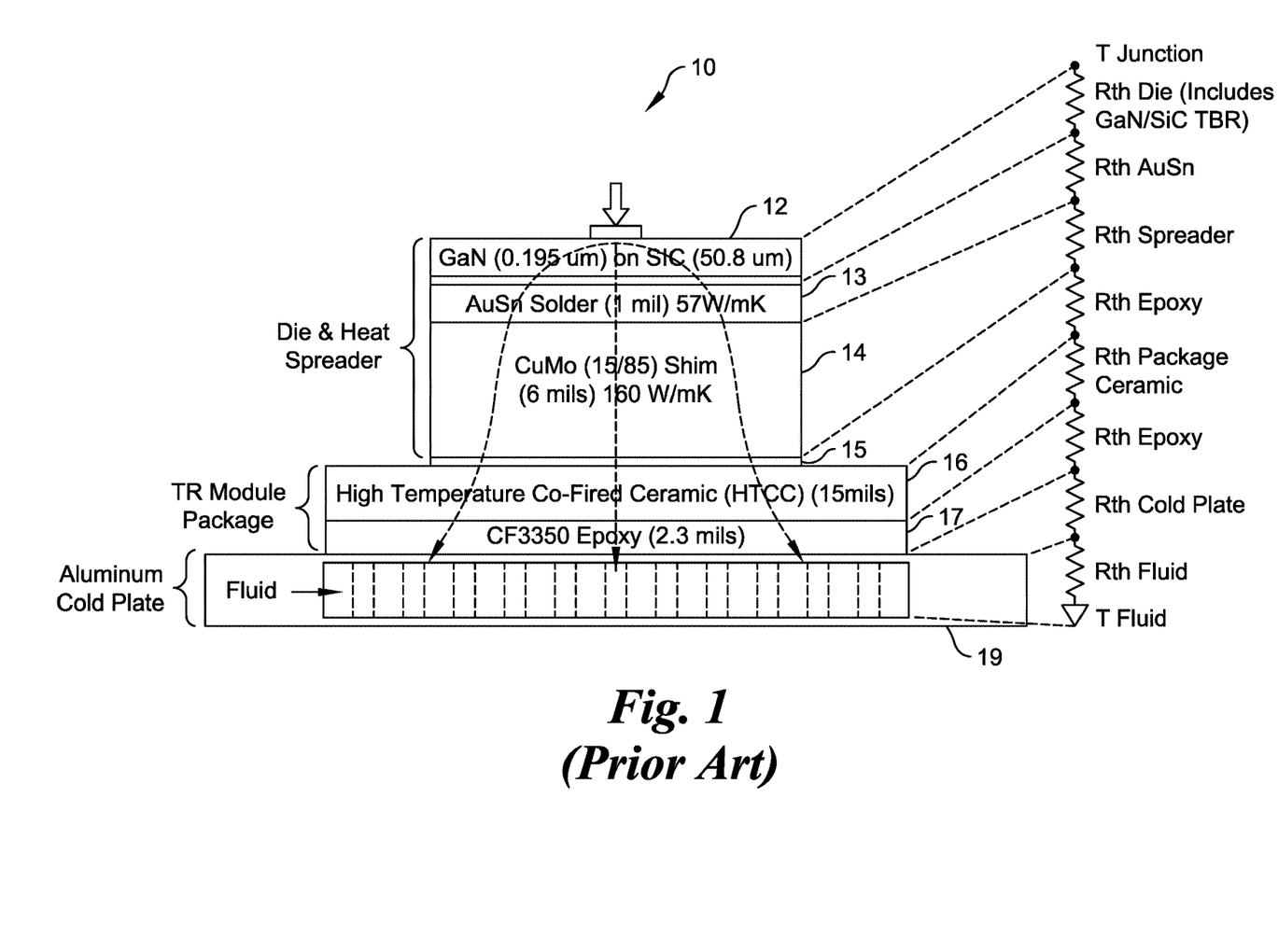
FIG. 1 is a simplified cross section view of a conventional remote cooling system.

Performance of many current commercial and military electronic systems is constrained by the limited cooling capabilities of conventional thermal management techniques. In the case of small-scale electronics, such as integrated circuit packages, and referring generally to FIG. 1, a typical "remote cooling" thermal management system 10 is shown. Heat generated by a source (e.g. a circuit die 12) is transferred through numerous intermediate material layers arranged between die 12 and a heat sink, such as a liquid-cooled cold plate 19. These layers may include, for example, a solder layer 13, a heat sink or heat spreading layer 14, a first epoxy layer 15, a ceramic layer 16, and a second epoxy layer 17 for attaching the device package to cold plate 19. As illustrated, each material presents a thermal resistance (Rth) to heat flow and adds to the overall thermal rise from the coolant to the device junction. While such assemblies provide some level of effectiveness, increases in device power and density resulting from packaging multiple devices together, have created systems with even greater cooling requirements. These systems, in many cases, exceed the capability of the exemplary illustrated remote cooling approaches to maintain acceptable junction temperatures.

Alternate thermal management systems and techniques are needed.

SUMMARY

In one embodiment of the present disclosure, a heat sink for cooling an integrated circuit device includes a body having a first side and a second side. A fluid inlet opening is formed in the second side of the body for receiving pressurized fluid from a fluid source. A plurality of impingement openings are formed in the first side of the body. At least one fluid delivery channel is formed through a portion of the body and is configured to deliver pressurized fluid from the fluid inlet opening to the plurality of impingement openings for generating a plurality of fluid streams expelled from the plurality of impingement openings. A plurality of fluid diverters are formed on the first side of the body and are arranged generally between each of the plurality of impingement openings for diverting a flow of fluid around each of the plurality of impingement openings. A plurality of fluid return openings are formed in the first side of the body for carrying fluid away from the first side of the body.

In another embodiment, a cooling system for an electronic device is provided. The system includes a heat sink configured to be mounted to the electronic device, and having a body defining a plurality of impingement jets. The impingement jets comprise apertures formed in the body and are responsive to a source of pressurized fluid for generating a plurality of fluid streams. A plurality of fluid diverters are also formed on the body of the heat sink and arranged generally between each of the plurality of impingement jets for diverting a flow of fluid around each of the plurality of impingement jets. The system further includes a fluid routing element configured to be mounted between the heat sink and a host cooling system for delivering pressurized fluid from the host cooling system to the plurality of impingement jets.

DETAILED DESCRIPTION

It is to be understood that the figures and descriptions of the present invention have been simplified to illustrate elements that are relevant for a clear understanding of the present invention, while eliminating, for purposes of clarity, many other elements found in electronic circuits and associated cooling systems, including embedded cooling systems configured for cooling integrated circuits. However, because such elements are well known in the art, and because they do not facilitate a better understanding of the present invention, a discussion of such elements is not provided herein. The disclosure herein is directed to all such variations and modifications known to those skilled in the art.

In the following detailed description, reference is made to the accompanying drawings that show, by way of illustration, specific embodiments in which the invention may be practiced. It is to be understood that the various embodiments of the invention, although different, are not necessarily mutually exclusive. Furthermore, a particular feature, structure, or characteristic described herein in connection with one embodiment may be implemented within other embodiments without departing from the scope of the invention. In addition, it is to be understood that the location or arrangement of individual elements within each disclosed embodiment may be modified without departing from the scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout several views.

Figure 2:
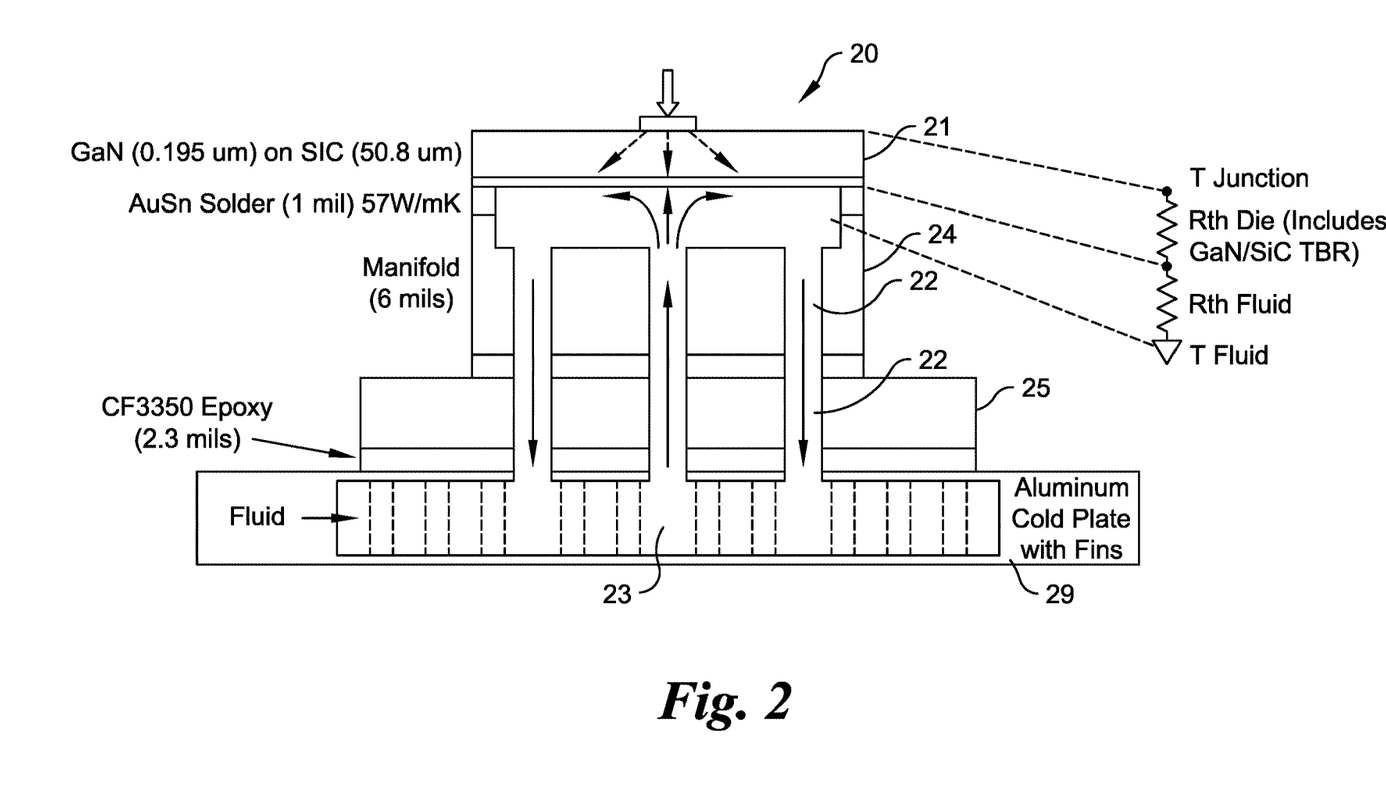
FIG. 2 is a simplified cross section view of an embedded cooling system.

Referring generally to FIG. 2, an exemplary embedded cooling system 20 useful for describing embodiments of the present disclosure is shown. As illustrated, in contrast to the conventional remote cooling system 10 shown in FIG. 1, there is disclosed an embedded cooling arrangement wherein pressurized coolant 23 is brought into closer proximity with a circuit die 21 via fluid passages 22 formed through the intermediate materials. In the exemplary illustrated embodiment, coolant 23 from the "system level" heat sink or cold plate 29, is brought through an intermediate fluid routing means embodied as ceramic package base 25 to the micro or "device level" heat sink or manifold 24. Manifold 24 ultimately contacts and supports die 21 on a base or bottom surface thereof and is configured to provide for the passage of coolant 23 therethrough.

In one implementation, coolant 23 is conveyed via internal passages 22 formed in manifold 24 and base package 25. In this way, coolant 23 may directly contact an underside of die 21. In other instances, coolant 23 may not directly contact die 21, but rather, may be contained in a self-sealed heat sink or manifold to which die 21 is bonded. In the latter case, a thin layer of material, such as solder or epoxy, may be used to join the die to the heat sink. In these embodiments, however, the presence of the intermediate joining material may degrade performance to some degree, depending upon the thickness and thermal conductivity of the joining material used.

An advantage of embedded cooling systems, such as those set forth above with respect to FIG. 2, is the elimination of a number of thermal interfaces. In practice, such elimination can translate into a reduction in the overall thermal resistance from junction to coolant. The reduced thermal resistance, in turn, results in lower operating temperatures for a given die dissipation, or conversely, allow a larger heat dissipation for a given temperature rise.

Despite these improvements, embedded cooling approaches have presented significant implementation challenges. Drawbacks of and/or difficulties associated with these embedded cooling systems include, but are not limited to: 1) achieving a sufficiently high heat transfer coefficient to prevent a large temperature rise in the fluid in contact with the die; 2) reducing the size of the micro heat sinks and their associated inlet and outlet connections in order to allow their integration into the small spaces required by actual systems; 3) ensuring leak proof seals; 4) preventing joining materials such as solders and epoxies from flowing into and clogging the micro channels and jets; and 5) achieving a cost-effective manufacturing process.

Embodiments of a micro jet impingement heat sink according to this disclosure have been shown to address at least some of the aforementioned shortcomings. In one embodiment, a heat sink for cooling an integrated circuit device is provided and includes a body having a first side and a second side. A fluid inlet opening is formed in the second side of the body for receiving pressurized fluid from a fluid source. A plurality of impingement openings are formed in the first side of the body. At least one fluid delivery channel is formed through a portion of the body and is configured to deliver pressurized fluid from the fluid inlet opening to the plurality of impingement openings for generating a plurality of fluid streams expelled from the plurality of impingement openings. A plurality of fluid diverters are formed on the first side of the body and are arranged generally between each of the plurality of impingement openings for diverting a flow of fluid around each of the plurality of impingement openings. A plurality of fluid return openings are formed in the first side of the body for carrying fluid away from the first side of the body.

Embodiments and applications of the present disclosure include, but are not limited to, applications to cool Transmit/Receive (T/R) module components and thermal management of high power amplifier (HPA) assemblies, GaN/SiC, GaN/Diamond and other MMIC semiconductor material devices, laser diode packages, and the like. Embodiments of the present invention yield significant benefits with regards to efficiency, power out, and lifespan associated with such devices and/or assemblies.

Figure 3:
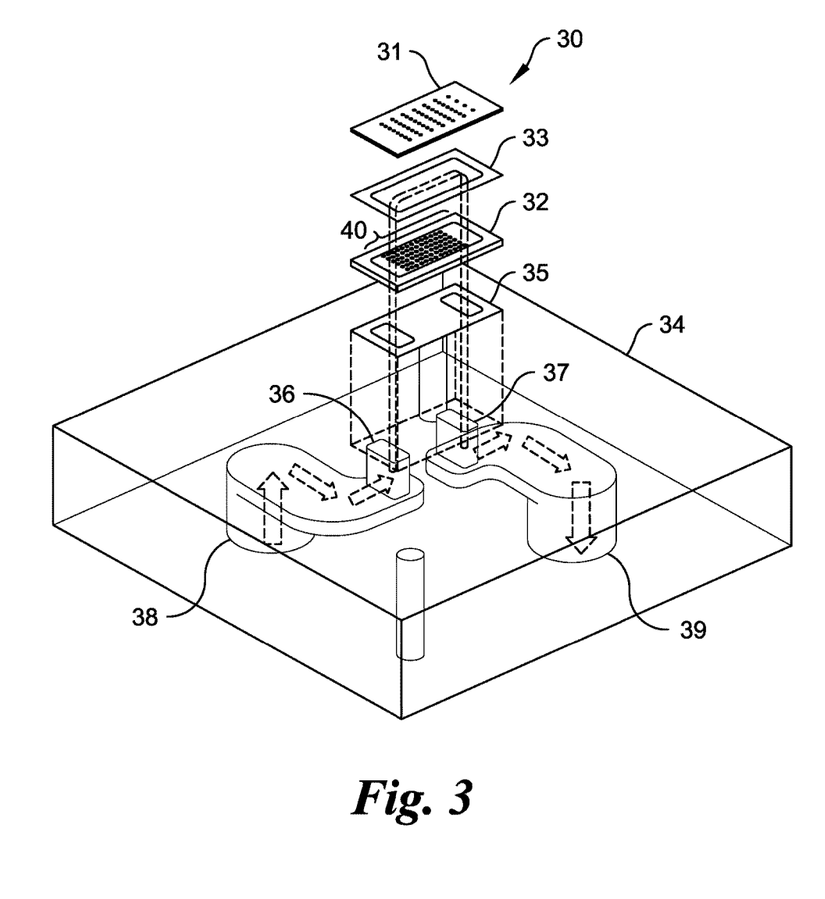
FIG. 3 is a simplified exploded view of a cooling system according to embodiments of the present disclosure.

A simplified exploded illustration of a micro jet impingement cooling system 30 according to an embodiment of the present disclosure is shown in FIG. 3. A circuit die 31 (e.g. GaN/SiC integrated circuit) to be cooled is attached about its lower perimeter surface to a micro jet impingement heat sink 32 using either a solder or epoxy attachment material 33 to form a leak-tight seal. Micro jet impingement heat sink 32 is attached to an intermediate manifold, embodied herein as a fluid routing means or element 34 using either an epoxy or solder attachment material 35 to form a second leak-tight seal. Fluid routing element 34 interfaces with micro jet impingement heat sink 32 at corresponding fluid (e.g. coolant) inlet opening 36 and outlet opening 37. Fluid routing element 34 also comprises larger fluid inlet and outlet ports 38, 39 for receiving and transporting fluid from/to a host cooling system (e.g. a larger cold plate, not shown). In this way, a fluid routing element serves as an interface between the micro jet impingement heat sink, with its relative small inlet and outlet holes, and an external environment, such as an electronic module or printed wiring board with larger fluidic inlet and outlet ports. Fluid routing element 34 may also take the form of ceramic package base 25 as illustrated in FIG. 2.

Still referring to FIG. 3, micro jet impingement heat sink 32 includes an integrated manifold arrangement (not shown), for converting the received fluid into a series of high velocity fluid streams or "impingement jets". The fluid streams are formed via a plurality of impingement openings or jets 40 formed on a side of heat sink 32 adjacent a bottom surface of die 31, and contact, and thus cool, a bottom surface of die 31. Depending on a desired flow rate, fluid supplied to jets 40 may be pressurized to approximately 30 to 100 pounds per square inch (PSI). The heated fluid is then returned to the host system via return passages formed in heat sink 32 (not shown). By way of non-limiting example, an exemplary fluid useful in tactical systems comprises a mixture of 40% propylene glycol and 60% water.

Figure 4:
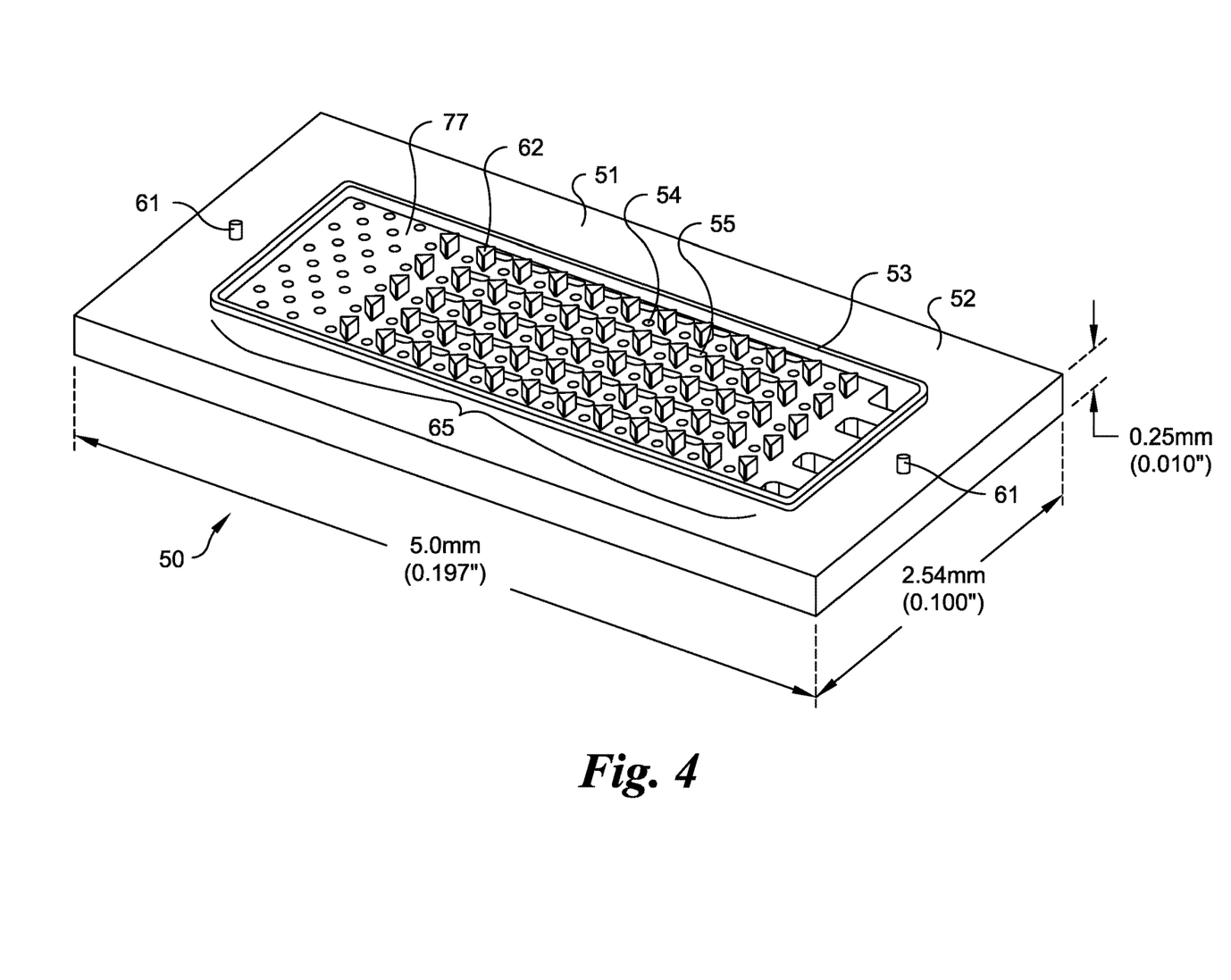
FIG. 4 is a schematic illustration showing the top of a micro jet impingement heat sink or manifold according to an embodiment of the present disclosure.
Figure 5:
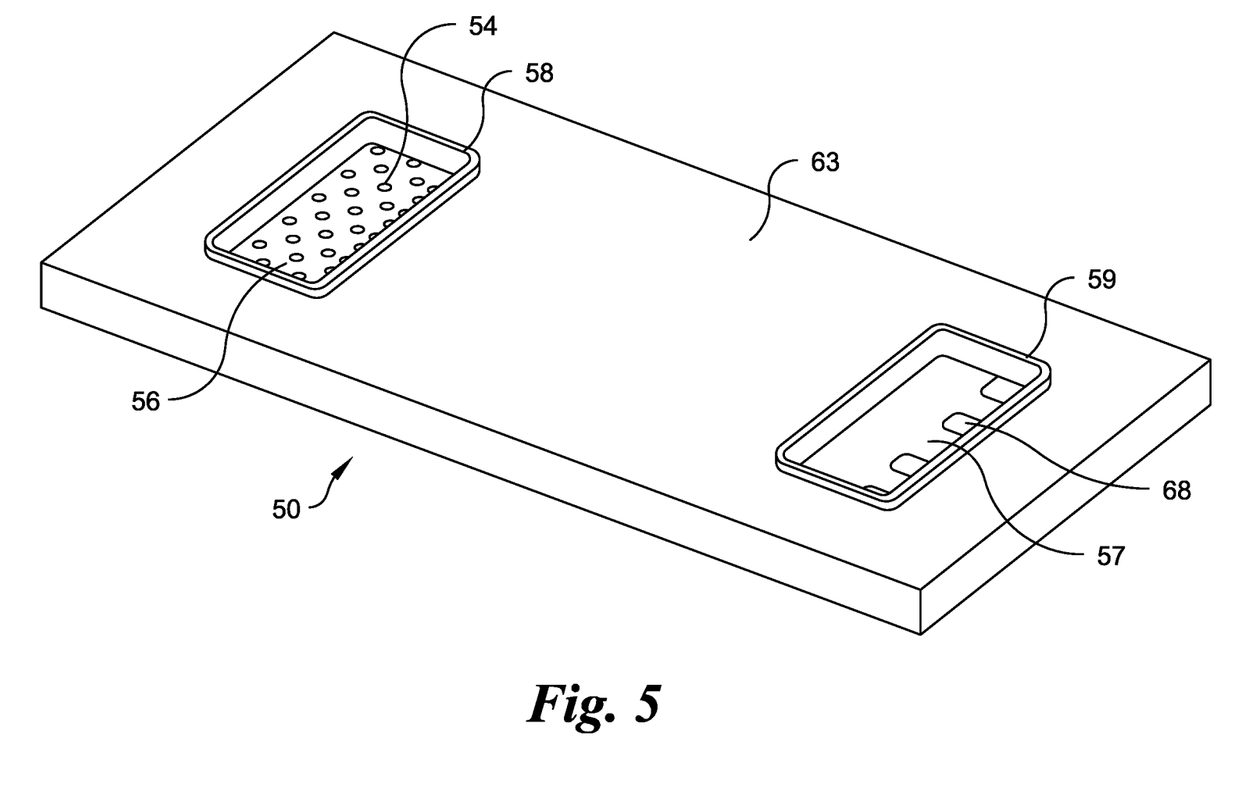
FIG. 5 is a schematic illustration showing the bottom of the micro jet impingement heat sink of FIG. 4, according to an embodiment of the present disclosure.

A particularly advantageous embodiment of a micro jet impingement heat sink or manifold 50 according to an embodiment of the present disclosure is shown in FIGS. 4, 5, 6A, 6B and 7. Referring generally to FIG. 4, exemplary heat sink 50 includes a body 51. Body 51 may be formed of a solid material, such as a metal or a metal alloy (e.g. palladium). Body 51 defines a generally planar upper or bonding surface 52 and a recessed area or interior fluid jet portion 65 formed therein defining a generally planar lower surface 77. Upper surface 52 forms a continuous perimeter about fluid jet portion 65. A die to be cooled (not shown) may be attached to upper surface 52 using either adhesive epoxy or a solder to form a liquid-tight seal. The attachment material may comprise a separate piece of pre-cut material, as illustrated in FIG. 3, or may be pre-deposited (sputtered, electro-deposited, etc.) onto upper surface 52 of heat sink 50 or onto the bottom of the die during its fabrication process.

Upper surface 52 of micro jet impingement heat sink 50 includes several novel features that overcome the above-described shortcomings of prior art heat sinks. For example, upper surface 52 of the illustrated embodiment includes protruding alignment pins 61 arranged thereon which are configured to interface with corresponding holes and/or slots etched in the bottom of a die to be cooled in order to accurately align the die and the heat sink. This allows the illustrated impingement openings or jets 54 to be easily and accurately aligned to alleviate specific or targeted "hot spots" (e.g. individual transistors) on the die. The use of pins 61 formed on heat sink 50 and corresponding holes in a die comprise only one exemplary alignment means. Other types of alignment features may include, for example, a raised rim (not shown) around the periphery of heat sink 50 (e.g. formed on an outer edge of upper surface 52) into which a die would be cradled. By way of further non-limiting example, transfer enhancing features disposed on the bottom of a die substrate (e.g. an SiC substrate) may include a set of etched features, namely, micropins, having diameters ranging from 25 microns to 35 microns etched in a SiC substrate for facilitating micro-scale heat transfers. In one example, a nominal or un-etched die thickness is 100 microns, with an etch depth of 72 microns.

Upper surface 52 of heat sink 50 may also include raised interior edges or a rim 53 formed about an inner-most edge of upper surface 52 for separating interior fluid jet portion 65 from upper surface 52. Raised rim 53 serves as a mechanical barrier to the flow of the die attachment material (e.g. solder) and prevents the attachment material from flowing into the impingement openings 54 or fluid return channels 55 of interior fluid jet portion 65. This ensures against clogging of these openings and/or channels during fabrication. Similarly, referring to FIG. 5, a bottom surface 63 defining a second side of heat sink 50 includes raised rims 58,59 generally bordering respective fluid inlet and outlet openings or ports 56,57. Fluid ports 56,57 provide pressurized fluid to impingement openings 54 from an external source, and to return fluid to the same.

Figure 6A:
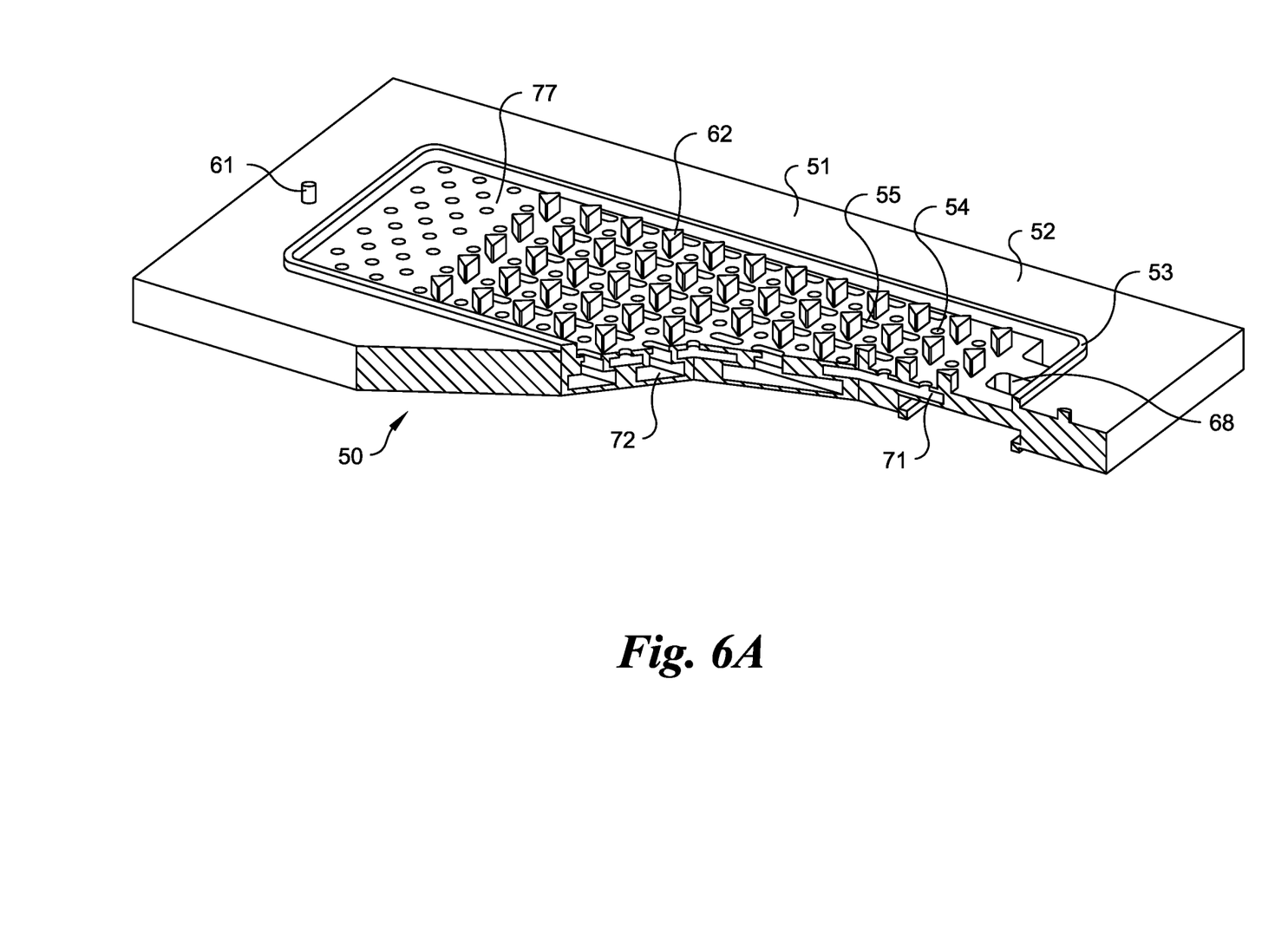
FIG. 6A is a partial cutaway illustration of the micro jet impingement heat sink of FIG. 4, according to an embodiment of the present disclosure.
Figure 6B:
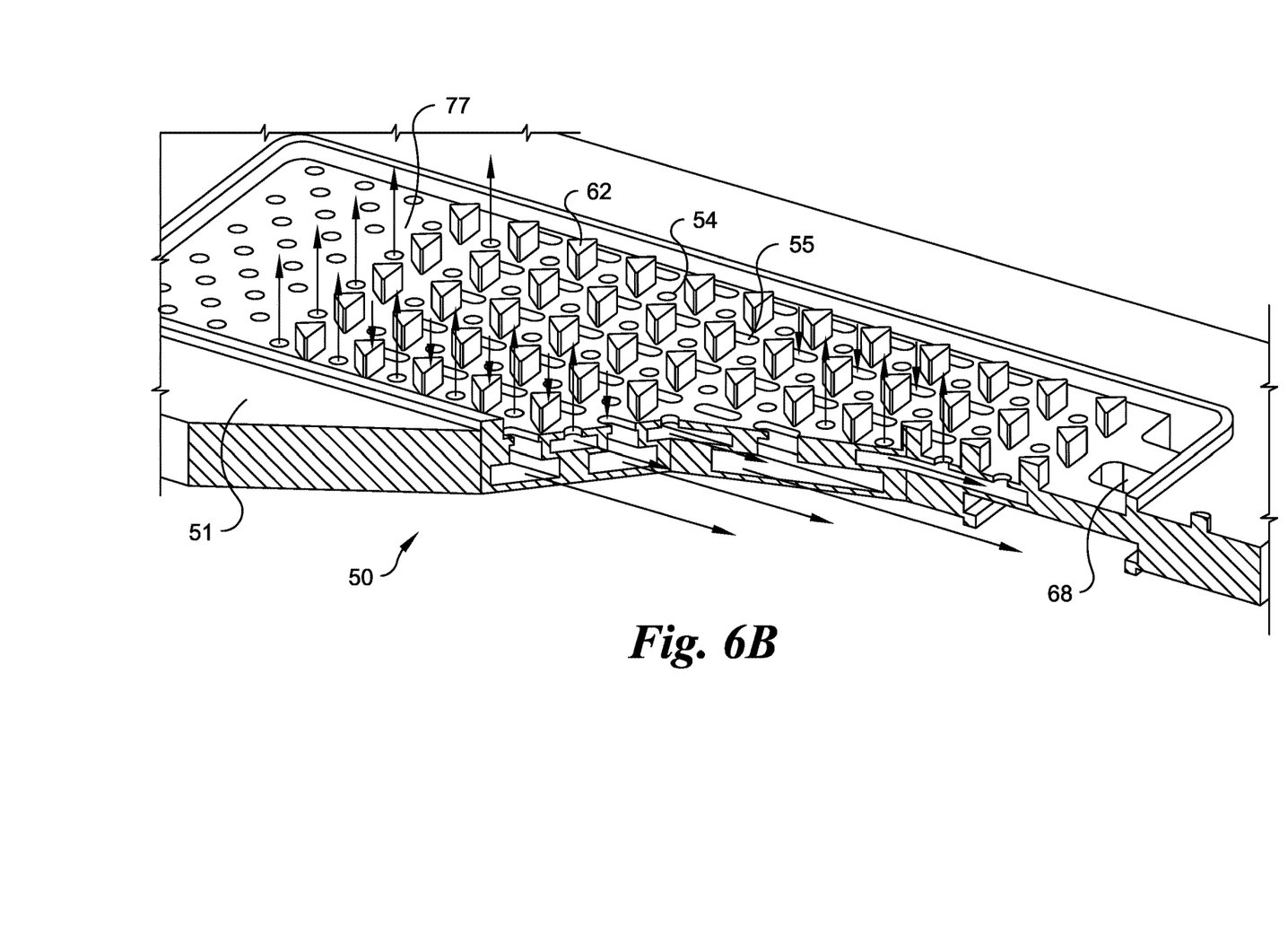
FIG. 6B is a partial cutaway illustration of the micro jet impingement heat sink of FIG. 4, showing the flow of fluid therethrough, according to an embodiment of the present disclosure.

With reference to FIGS. 6A and 6B, heat sink 50 includes a plurality of internal fluid channels for supplying and returning fluid. Specifically, in one embodiment, fluid is routed internally within heat sink 50 in a series of parallel channels which are isolated from one another. There are two levels of internal channels in the illustrated embodiment. Supply channels 71 are arranged proximate to upper surface 52 of heat sink 50 and used to transport low temperature "cool" fluid (i.e. fluid which has not yet contacted the die) to downstream impingement openings 54 in order to enable jet impingement with unheated fluid along the entire length of the die. Return channels 72, located proximate bottom surface 63 of heat sink 50, serve as return paths for the higher temperature or "heated" fluid, which has impinged on the back or adjacent side of the die and which has been heated in the process. The fluid is injected into return channels 72 via oval-shaped fluid return ports 55 distributed along the length of heat sink 50, between each pair of impingement openings 54.

Figure 7:
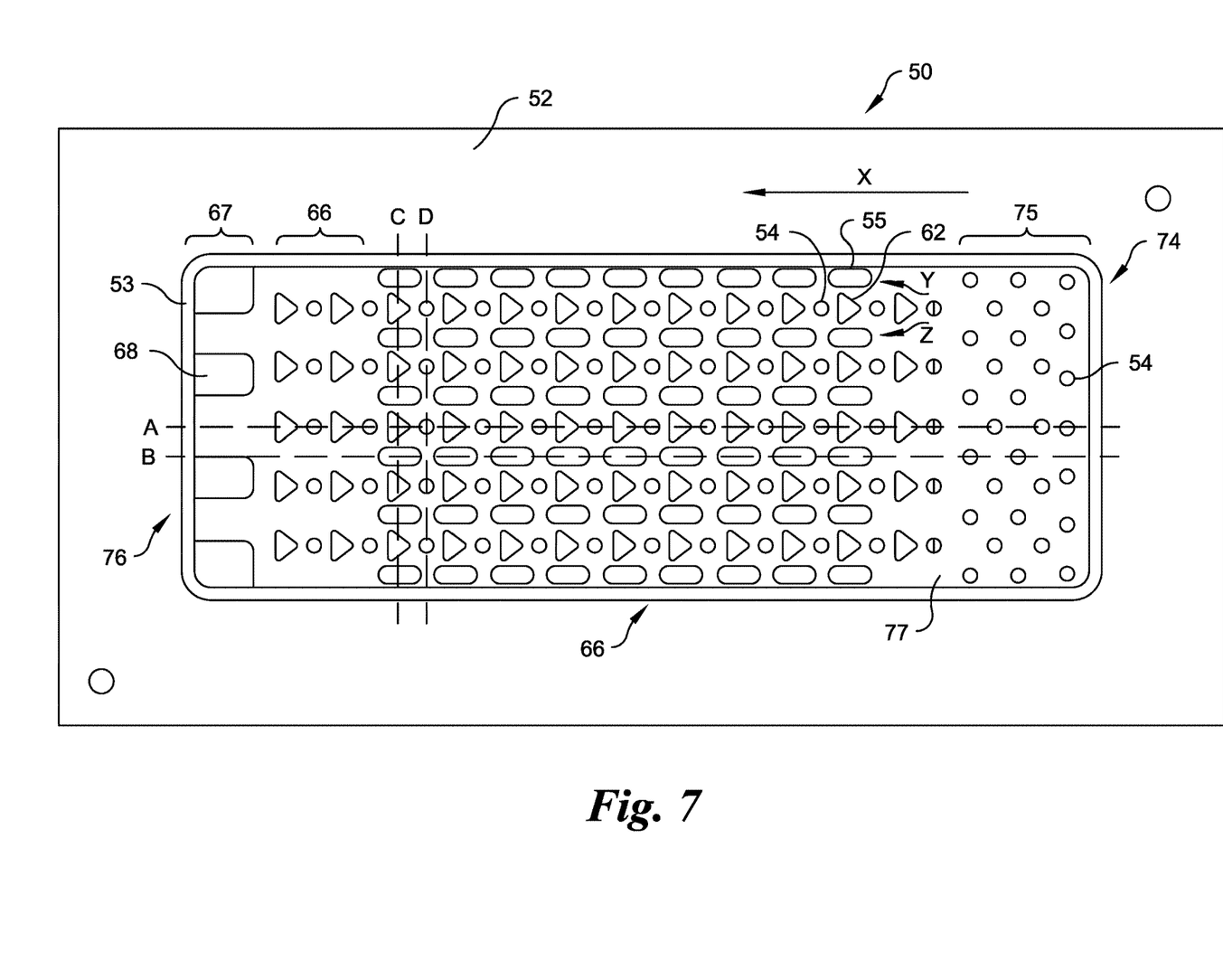
FIG. 7 is a top perspective view of the micro jet impingement heat sink of FIG. 4.

Referring in particular to FIG. 7, exemplary heat sink or manifold 50 contains roughly ninety circular, 60 micrometers (um) (2.4 mil) diameter impingement openings or jets 54 formed in body 51 arranged in a roughly 200 um (7.9 mil) pitch repeating pattern. In the exemplary embodiment, approximately fifty-five interspersed oval-shaped fluid return ports or openings 55 are also formed in body 51 to extract some of the fluid injected from each impingement opening 54 for minimizing jet to jet interactions. Return ports 55 are configured (e.g. sized and located) to prevent what would otherwise be a large crossflow effect on downstream impingement openings 54. More specifically, cooling of the die occurs by a combination of submerged jet impingement at the jet locations and microchannel flow at non-jet locations. The effect of "spent fluid" from upstream impingement openings 54 on the performance of downstream impingement openings 54 (i.e. the "crossflow" effect) degrades the performance of the downstream impingement jets. In the illustrated embodiment, a crossflow may be defined as a flow of fluid along lower surface 77 of interior jet portion 65 in an exemplary illustrated direction "X".

In order to further mitigate the negative effects of fluid crossflow, embodiments of the present disclosure incorporate a series of integral flow diverters 62 formed on lower surface 77 of interior jet portion 65. In one embodiment, each diverter 62 may take the form of a protrusion or block that is formed integrally with body 51 (i.e. forming a monolithic structure). Each exemplary diverter 62 includes a generally planar top surface, a bottom surface and three side walls that define a protrusion with a generally triangular cross section. Each diverter 62 is configured to divert an upstream flow of fluid around a corresponding downstream impingement opening 54 (i.e. an impingement opening 54 arranged adjacent to a triangular diverter 62 on a side of the diverter opposite an apex of the triangle) in order to prevent the flow from disrupting (e.g. "bending") the expelled fluid jet. As illustrated, fluid acting on a portion (e.g. an apex) of a diverter 62 is redirected into respective fluid flows Y,Z. Fluid flows Y,Z are subsequently diverted around a downstream impingement opening 54, and generally toward a respective return port 55. Flow diverters 62 also prevent the establishment of a thick fluid boundary layer which would reduce the heat transfer potential of the device.

While the generally triangular diverters 62 have been shown to provide improved performance, it should be understood that diverters of other shapes and/or sizes (height/width) may be used without departing from the scope of the present disclosure. These diverters may include profiles similar to that of a triangle, specifically, other profiles defining an apex or vertex that may be oriented in a direction toward a fluid crossflow for diverting fluid in the described manner. Likewise, diverters comprising profiles which are generally convex with respect to a direction of fluid crossflow may also be used for achieving similar fluid diversion. The height of each diverter may range from approximately one-half to the full depth of the recess of a given interior jet portion.

Interior jet portion 65 may include impingement openings 54 arranged in a plurality of columns D. Between each column D is arranged a respective column C comprising alternating return ports 55 and flow diverters 62. Likewise, from the perspective of the direction of fluid crossflow X, interior jet portion 65 includes return ports 55 arranged in rows B. Between each row B is arranged a respective row A of alternating impingement openings 54 and flow diverters 62. This patterned and uniform configuration operates to minimize thermal rise from coolant to device junction.

In the exemplary embodiment, additional impingement openings 54 may also be formed in a region 75 proximate a first end 74 of interior jet portion 65. As first end 74 corresponds to the inlet or inlet side of heat sink 50, crossflow effects are relatively minimal in this region, and therefor, no flow diverters or return ports are required. Further, each row A of alternating impingement openings 54 and flow diverters 62 may extend into a region 66 proximate a second or downstream end 76 of heat sink 50 wherein no return ports 55 are present. A series of drainage ports 68 may be formed in a region 67 at second end 76 of interior fluid jet portion 65 for collecting fluid not captured by return ports 55.

Figure 8:
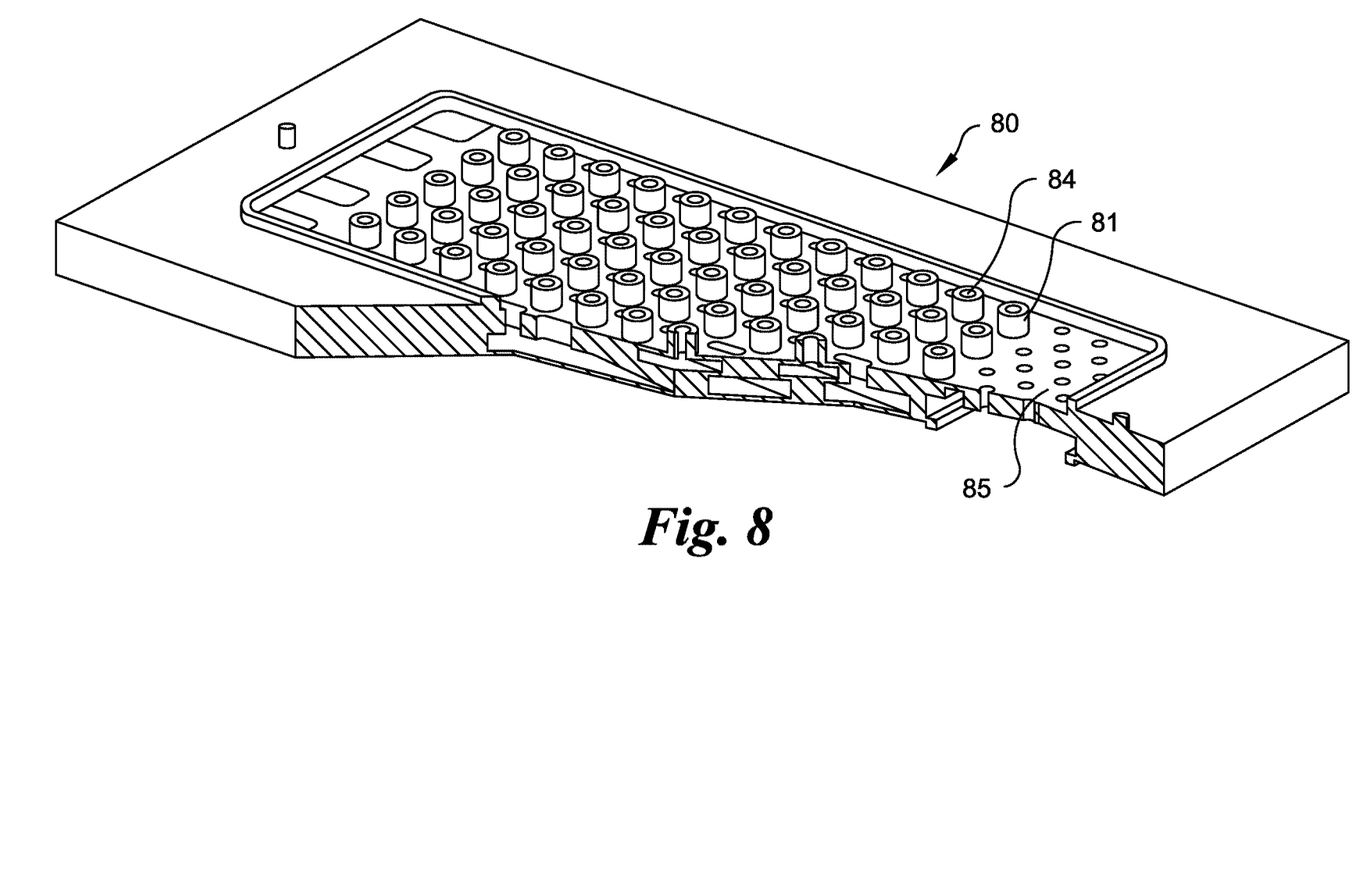
FIG. 8 is a partial cutaway illustration showing a micro jet impingement heat sink according to an embodiment of the present disclosure.

FIG. 8 illustrates a distinct embodiment of a heat sink or manifold 80 of the present disclosure. Heat sink 80 includes tubular or cylindrical structures 81 protruding from a surface 85 of heat sink 80. Each tubular structure 81 includes an opening formed therethrough defining all or part an impingement jet 84 in communication with pressurized fluid. In addition to forming a portion of the impingement jets, structures 81 act to prevent fluid crossflow effects by blocking return fluid from interfering with each fluid stream. With the exception of these distinctive integrated impingement jets and cylindrical flow diverters, heat sink 80 comprises features similar to those set forth above with respect to heat sink 50.

The micro jet impingement heat sinks according to embodiments of the present disclosure may be fabricated using additive processes, such as a 3D, additive, wafer-scale, photolithographic process. Although embodiments may be manufactured using conventional etching (subtractive) processes, these methods would require a multi-part design, with each part comprising a thin section or segment of the above-described heat sink. These individual parts would then have to be bonded together to form a single, water-tight assembly. In addition to being cost prohibitive, fabrication using conventional machining (subtractive) processes may not be technically feasible due to leakage. The use of additive manufacturing methods enables embodiments to be manufactured in a cost effective and reliable manner.

Embodiments of the present disclosure provide at least the following benefits over prior art systems.

The enablement of additive, wafer-scale construction processes allows embodiments of the present disclosure to be compact and thin. The illustrated embodiments, for instance, may measure only 2.5 mm×5 mm×0.25 mm, allowing integration into existing size-constrained packages. Prior art heat sinks manufactured using "subtractive" processing, such as conventional micro-machining or wet/dry etching, and are typically much thicker.

Embodiments of the micro jet impingement heat sinks described herein may be manufactured using a batch wafer scale process, enabling hundreds to thousands of parts to be manufactured on a single wafer, reducing production costs.

Embodiments of the micro jet impingement heat sinks according to embodiments of the present disclosure may comprise a monolithic (single piece) construction, with no adhesives or solders joining individual layers, eliminating the potential for layer separation or leakage under pressure. Prior art micro heat sinks are produced by bonding multiple fabricated parts, such as bonding together etched silicon wafers, together which introduces a bonded joint between the individual layers. Having interfaces increases the thickness of the heat sinks, creates mechanically weaknesses, and introduces additional interfaces for leakage.

Embodiments of the micro jet impingement heat sinks may include separate internal networks of supply and return fluid flow channels, allowing supply of unheated coolant to the entire base of the die and resulting in a more uniform thermal profile within the die.

Embodiments of the micro jet impingement heat sinks incorporate a series of integral flow diverters that divert the upstream flow around each individual downstream jet in order to prevent the flow from disrupting (bending) the fluid jet from impinging on the bottom of the die and also disrupt unwanted fluid boundary layer development. This enhances the heat transfer performance of the downstream jets and of the heat sink overall.

Embodiments of the micro jet impingement heat sinks include raised edges (rims) on the upper and lower surfaces which separate the interior fluid portion of the heat sink from the adjacent attachment surfaces. The raised rims serve as mechanical barriers to the flow of attachment materials and prevent the attachment materials from flowing into the micro heat sink jets or channels and clogging the jets and/or channels.

While the foregoing invention has been described with reference to the above-described embodiment, various additional modifications and changes can be made without departing from the spirit of the invention. Accordingly, all such modifications and changes are considered to be within the scope of the appended claims. Accordingly, the specification and the drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations of variations of various embodiments. Combinations of the above embodiments, and other embodiments not specifically described herein, will be apparent to those of skill in the art upon reviewing the above description.

What is claimed is:

1. A heat sink for cooling an electronic device, comprising:
   a body having a first side and a second side opposite the first side;
   a fluid inlet opening for receiving pressurized fluid from a fluid source;
   a plurality of impingement openings formed in the first side of the body;
   at least one fluid delivery channel formed through a portion of the body and configured to deliver pressurized fluid from the fluid inlet opening to the plurality of impingement openings for generating a plurality of fluid streams expelled from the plurality of impingement openings;

a plurality of fluid diverters formed on the first side of the body and arranged between each of the plurality of impingement openings for diverting a flow of fluid across the first side of the body around each of the plurality of impingement openings, wherein each of the plurality of fluid diverters comprises a cross-section defining a vertex, and wherein the vertex of each of the plurality of fluid diverters is oriented toward a direction of the flow of fluid;

a plurality of fluid return openings formed in the first side of the body and configured to carry fluid away from the first side of the body, the plurality of fluid return openings interspersed between the plurality of fluid diverters and impingement jets so as to receive a portion of the fluid diverted by the plurality of diverters;

wherein the at least one fluid delivery channel is located proximate the first side of said heat sink and configured to transport low temperature fluid to downstream impingement openings to enable jet impingement with low temperature fluid along a length of an electronic device to be cooled; and a second fluid delivery channel isolated from the first fluid delivery channel and located proximate the second side of the heat sink, the second fluid delivery channel configured to receive and transport from the plurality of fluid return openings higher temperature return fluid having impinged on a length of the electronic device to be cooled.

2. The heat sink of claim 1, wherein each of the plurality of fluid diverters are sized and positioned so as to divert the flow of fluid toward the plurality of fluid return openings.

3. The heat sink of claim 1, wherein each of the plurality of fluid diverters comprises a triangular cross section.

4. The heat sink of claim 1, wherein the plurality of impingement openings are arranged in a plurality of first columns on the first side of the body, wherein the plurality of fluid return openings and fluid diverters are arranged in a plurality of second columns on the first side of the body, with each second column comprising alternating fluid return openings and fluid diverters, and wherein each first column is positioned between a pair of second columns.

5. The heat sink of claim 1, wherein the fluid inlet opening is formed in the second side of the body.

6. The heat sink of claim 1, wherein the plurality of fluid diverters are formed integrally with the body.

7. A heat sink for cooling an electronic device, comprising:

a body having a first side and a second side;

a plurality of impingement jets formed in the first side of the body, each impingement jet comprising an aperture formed in the body and responsive to a source of pressurized fluid for generating a plurality of fluid streams expelled from the body;

a plurality of fluid return openings formed in the first side of the body and configured to carry fluid away from the first side of the body; and a plurality of fluid diverters formed on the first side of the body and arranged between each of the plurality of impingement jets for diverting a flow of fluid around each of the plurality of impingement jets, wherein the plurality of impingement jets, fluid return openings, and fluid diverters are arranged in a pattern of rows and columns, wherein the plurality of impingement jets are arranged in a plurality of first columns on the first side of the body, the plurality of fluid return openings and fluid diverters are arranged in a plurality of second columns on the first side of the body, with each second column comprising alternating fluid return openings and fluid diverters, and wherein each first column of impingement jets is positioned between a pair of second columns of alternating fluid return openings and fluid diverters, and wherein alternating rows of said pattern comprise alternating first and second rows defined by: a) fluid return openings in a plurality of first rows on the first side of the body; and b) alternating impingement jets and fluid diverters in a plurality of second rows on the first side of the body.

8. The heat sink of claim 7, further comprising at least one fluid delivery channel formed in the body and configured to deliver pressurized fluid to the plurality of impingement jets.

9. The heat sink of claim 8, further comprising a fluid inlet opening in communication with the at least one fluid delivery channel formed in the body for receiving pressurized fluid from a fluid source.

10. The heat sink of claim 7, wherein the plurality of apertures defining the plurality of impingement jets open toward the first side of the body.

11. The heat sink of claim 10, wherein the body defines a first planar surface on the first side thereof.

12. The heat sink of claim 11, further comprising a recess formed in the first side of the body defining a second planar surface.

13. The heat sink of claim 12, wherein the plurality of apertures defining the plurality of impingement jets are formed in the second planar surface.

14. The heat sink of claim 13, wherein the plurality of fluid diverters are formed on the second planar surface.

15. The heat sink of claim 14, wherein the plurality of impingement jets are oriented such that the plurality of fluid streams expelled therefrom impinge on a surface of an integrated circuit device mounted to the first planar surface.

16. A cooling system for an electronic device, comprising:

a heat sink configured to be mounted to the electronic device, the heat sink comprising:

a body defining a plurality of impingement jets, each impingement jet comprising an aperture formed in the body and responsive to a source of pressurized fluid for generating a plurality of fluid streams; and a plurality of fluid diverters formed on the body and arranged between each of the plurality of impingement jets for diverting a flow of fluid around each of the plurality of impingement jets, and a plurality of fluid return openings formed in the body and configured to carry fluid away from the body, the plurality of fluid return openings positioned in a pattern of columns and rows comprising alternating fluid return openings and diverters along a given column, and sequentially positioned fluid return openings along a given row, wherein each of said plurality of fluid return openings is further positioned in relation to a corresponding one of said plurality of diverters, and to a corresponding one of said plurality of impingement jets, so as to receive and carry away a portion of the fluid diverted by the corresponding diverter away from a downstream impingement jet; and a fluid routing element configured to be mounted between the heat sink and a host cooling system for delivering pressurized fluid from the host cooling system to the plurality of impingement jets.

17. The system of claim 16, wherein each of the plurality of fluid return openings is oval-shaped and has dimensions greater than those of said plurality of impingement jets.

18. The system of claim 16, wherein the fluid routing element comprises:

an inlet opening formed in a first side of the fluid routing element and configured to interface with a fluid inlet opening of the heat sink;

an outlet opening formed in the first side of the fluid routing element and configured to interface with a fluid outlet opening of the heat sink;

an inlet port formed in a second side of the fluid routing element opposite the first side and in communication with the inlet opening for receiving fluid from the host cooling system; and an outlet port formed in the second side of the fluid routing element and in communication with the outlet opening for returning fluid to the host cooling system.

19. The system of claim 18, wherein an opening defined by the inlet port is larger than the inlet opening, and wherein an opening defined by the outlet port is larger than the outlet opening.

* * * * *